United States Patent [19]

Harrison et al.

[11] Patent Number: 5,349,691
[45] Date of Patent: Sep. 20, 1994

[54] PROGRAMMING PROCESS FOR 3-LEVEL PROGRAMMING LOGIC DEVICES

[75] Inventors: David A. Harrison, Cupertino, Calif.; Abdul Malik, Fishkill, N.Y.

[73] Assignee: Xilinx, Inc., San Jose, Calif.

[21] Appl. No.: 58,679

[22] Filed: May 4, 1993

Related U.S. Application Data

[63] Continuation of Ser. No. 547,861, Jul. 3, 1990, abandoned.

[51] Int. Cl.$^5$ .............................. G06F 9/302
[52] U.S. Cl. ................... 395/800; 364/718; 364/735; 364/750.5; 364/258; 364/DIG. 1; 307/465
[58] Field of Search ............... 395/800, 650; 307/465; 364/716, 736, 741, 750.5, 735; 340/825.79, 825.8

[56] References Cited

U.S. PATENT DOCUMENTS

| | | | |
|---|---|---|---|
| 4,247,892 | 1/1981 | Lawrence | 395/200 |
| 4,871,930 | 10/1989 | Wong et al. | 307/465 |
| 5,021,690 | 6/1990 | Linz | 307/465 |
| 5,023,606 | 6/1991 | Kaplinsky | 340/825.8 |
| 5,046,035 | 9/1991 | Jigour et al. | 364/716 |
| 5,099,150 | 3/1992 | Steele | 307/465 |
| 5,121,359 | 6/1992 | Steele | 365/229 |
| 5,128,559 | 7/1992 | Steele | 307/465 |

OTHER PUBLICATIONS

Altera, "Multiple Array Matrix High Density EPLDs", pp. 136–141 and 146–147.
C. M. Fiduccia et al., "A Linear-Time Heuristic for Improving Network Partitions", *19th Design Automation Conference*, 1982.

Primary Examiner—Alyssa H. Bowler
Assistant Examiner—Alpesh M. Shah
Attorney, Agent, or Firm—Schneck & McHugh

[57] ABSTRACT

A process of programming a programmable logic device (PLD) to carry out a specified logic function. The PLD contains three levels of logic implemented as a plurality of functional blocks, each with AND and OR planes, and a programmable interconnect matrix or logic expander carrying out AND logic. After providing such a PLD with specified size constraints and after specifying a logic function, the function is split or factored into subfunctions or factors. A Boolean factorization procedure chooses factors by replacing pairs of product terms in the first factor with their supercube and minimizing the number input terms and product terms required. Subfunctions or factors which are too large can be simplified by combining pairs of inputs in the interconnect matrix. The product terms of a subfunction or factor can be ordered according to the number of input terms they have and assigned to the functional blocks one at a time. Functional blocks which use many inputs or product terms per output can have some of their assigned subfunctions split so as to pack the PLD more densely. Split subfunctions or factors are recombined in the interconnect matrix. After assigning terms to functional blocks and the matrix, they are loaded into the PLD using a device programmer to configure the logic arrays in the PLD.

24 Claims, 12 Drawing Sheets

PROGRAMMING PROCESS FOR 3-LEVEL PROGRAMMING LOGIC DEVICES

This is a continuation of copending application(s) Ser. No. 07/547,861 filed on Jul. 3, 1990, now abandoned.

TECHNICAL FIELD

The present invention relates to the programming of programmable logic devices (PLDs) to implement a specific logic function, and in particular to the programming of PLDs that contain three levels of logic, such as multiple AND array/OR array functional units connected by an additional logical unit or an interconnect matrix.

BACKGROUND ART

Programmable logic devices (PLDs) are a class of integrated circuits which can be programmed by a user after they have been fabricated so as to emulate various logic functions. Logic designers typically use PLDs to implement control logic in electronic systems, because they are relatively easy to program and can be reprogrammed when necessary to change their logic. This makes their use in an electronic system's design phase less costly than the custom hardwired or "application specific" integrated circuits (ASICs).

One major class of PLDs has a set of input pins, a programmable AND plane connected to the input pins, an OR plane connected to outputs of the AND plane and a set of output pins connected to outputs of the OR plane. The AND plane provides a matrix of programmable connections where each column connects to an input pin and each row forms an output of the AND plane, called a product term line, which connects to the OR plane. The OR plane may be programmable, such that each product term line is connectable to columns leading to different output pins, in which case the PLD is called a programmable logic array (PLA). Alternatively, the OR plane may be fixed, such that each product term line is assigned to a particular output pin, in which case the PLD is called a programmable array logic (PAL) device.

The PLDs just described contain two levels of logic (AND and OR) and are capable of implementing logic functions that are representable in "sum of products" form. A sum of products form of a logic function is essentially a set of product terms for each output of the function. Such a logic function is represented in a PLD by programmed connections in the AND plane and OR plane. Each product term line has a programmable input connection in the AND plane to each input pin and produces a single output value representing the logical AND or "product" of the connected inputs. Usually both the original input pin value and its complement are available for connection to a product term line. Each output has a programmable product term connection in the OR plane and produces an output value representing the logical OR or "sum" of the connected product terms.

Recently, PLDs with more complex architectures have been developed. Such architectures use two or more functional blocks, each structured like the two-level PLDs described above, which are connected together to produce the final output or outputs. Connection of functional blocks may be done in a number of ways. One connection scheme uses the outputs of the functional blocks as inputs to another functional block or blocks, again structured like a simple two-level PLD. However, because an input assignment must propagate through two or more PLD functional blocks before the correct output pattern can be obtained, the propagation delay of this scheme is usually at least twice that of a single two level PLD. Another connection scheme combines outputs from two or more functional blocks in a logic expander. The logic expander is usually just a product term array and possibly followed by an inverter array which provides the necessary logical connection with less propagation delay than a PLD functional block. A third connection scheme uses a programmable interconnect matrix to logically AND inputs to or outputs from the functional blocks.

PLDs of any of the above described architectures are electronically configured, mapped or "programmed" to implement a specific logic function. A logic function in a PLD device takes a set of input pins and for each possible input assignment value produces an output pattern on the set of output pins. Usually there are a plurality of output pins and the function is a multiple output function. A single output function is a special logic function requiring only one output pin. Logic functions need not necessarily be connected to input and output pins. They may refer to the values of internal registers, and so in speaking of pins, it will be understood that internal registers are equivalents. The type of logic functions which can be implemented on a PLD described above is that which can be represented in "sum-of-products" form. The sum-of-products form of a function is essentially a set of product terms, where product terms are formed by the logical AND of one or more inputs. Such a function is easily implemented in a simple two-level PLD by connecting selected columns representing inputs or their complements in the AND plane with selected rows, i.e. product term lines, to produce product terms and connecting selected rows representing these product terms in the OR plane with selected columns to form the outputs.

It is standard practice for logic designers using two-level logic PLDs to use logic minimization steps to more efficiently program those PLDs. Logic minimization takes advantage of the realization that many different sum-of-products forms may exist for the same function, and that one particular form may be selected so as to minimize the number of required product terms. If the PLD allows for programmable inversion of the outputs, the inverse of the desired function may require fewer product terms than the function itself. In the case of PLAs and other PLDs that allow sharing of all or some product terms, a multiple output function with common product terms may be more efficiently programmed by taking advantage of this feature. Thus, these techniques allow users to pack more logic onto a given PLD.

With regard to the efficient programming of the more complex three-level logic PLDs, problems are manifest in areas such as the breaking up of a logic function into a plurality of subfunctions that can be programmed into separate output cells or functional blocks, what to do when a particular subfunction has too many input variables or product terms, or both, to fit into a single functional block, and how to make best use of the available third level of logic. One approach merely applies the logic minimization steps used for two-level logic PLDs to the subfunctions to better pack those subfunctions into the functional blocks, but does not address the situation where one or more of the subfunctions do not fit, even after minimization. The bulk of the research on multilevel logic synthesis has focused ASIC design, not in PLD functional block assignments.

Accordingly, an object of the present invention is to provide a process for programming a PLD having multiple functional blocks connected by a third level of logic, such as an interconnect matrix, which does not introduce significant propagation delays, which can handle logic having input or product term requirements that exceed the capacity of any one functional block, and which can program larger functions into the PLD.

DISCLOSURE OF THE INVENTION

The above object has been met with a programming process for a PLD in which a logic function to be implemented by that PLD and represented in sum-of-products form is factored a number of different ways into two or more subfunctions, also in sum-of-products form, with the object of minimizing the total number of product terms required. Factoring is done by first assigning all of the product terms in the function to one logical functional block, then selectively moving product terms forming a factor into another logical functional block. The particular factor to be moved is chosen by replacing pairs of existing product terms in the function with a product term, called a "supercube", whose input terms consist only of those inputs which are present in both product terms of the replaced pair. After factoring, the total number of product terms is compared with previous factorings to identify the minimum. One can map the logical functional blocks onto the same physical functional block.

The object has also been met with a process in which a function or subfunction that has too many inputs or product terms to fit within one functional block is split into individual product terms, sorted by the number of inputs each product term has, and beginning with the largest product term placed first in one logical functional block until full and then in subsequent logical functional blocks. The outputs of each logical block are combined in the interconnect matrix and typically inverted to recover the original function. Another way to reduce the number of inputs or product terms or both is to select pairs of inputs and combine then in the interconnect matrix prior to their being input into one or more functional blocks. A trade-off can be made in the number of inputs or product terms depending on which is more constrained in the PLD for that function. Even more efficient mapping of a function onto a PLD can be had by examining whether a functional block which is full or nearly full has used up all of its outputs. If a functional block's outputs are not fully used, then subfunctions which have a large number of inputs or product terms per output are split further, and the functional blocks are remapped. The outputs of split subfunctions are combined in the interconnect matrix.

The process basically involves providing a programmable logic device to be programmed and specifying a logic function to be programmed into the programmable logic device, determining how to configure the programmable logic device to carry out that logic function and then actually configuring the programmable logic device. In the present invention, the programmable logic device is of the type having multiple logic blocks, each block having sets of inputs and outputs and a pair of successive configurable arrays for carrying out first and second levels of logic, and a programmable interconnect matrix, logic expander or other configurable means for connecting the outputs for the logic blocks in a third level of logic. The three levels of logic are typically AND, OR and AND, respectively. The logic function specified should be representable in a sum-of-products form. After determining how best to configure the device to carry out the specified logic function by means of one or more of the techniques briefly described above and explained in greater detail below, the device is configured by charging or discharging the floating gate of the appropriate EPROM or EEPROM cells or by blowing the appropriate fuses so as to connect functional block inputs or their complements to selected product term lines in the first level logic array, thereby assigning product terms to the functional blocks, to connect product term lines to selected functional block outputs in the second level logic array, thereby assigning set of product terms to those outputs, and to connect selected functional block inputs and outputs to each other and to input and output pins in a third level of logic, thereby combining terms to be input to an output from the functional blocks.

An advantage of the present invention's procedure for determining how to configure a PLD is that larger functions can be implemented than might otherwise be the case with prior art techniques. For functions with a small number of product terms or functions having a large number of possible factorizations with small numbers of inputs and product terms per factor, the improvement over prior programming processes will likely be very slight. However, as the size of the functions to be programmed increase and it becomes more difficult to configure a PLD to implement those functions, there will be some functions that cannot be programmed using prior processes but which are still programmable when using the present invention. This will become more apparent from the detailed description which follows.

BEST MODE FOR CARRYING OUT THE INVENTION

Figure 1:
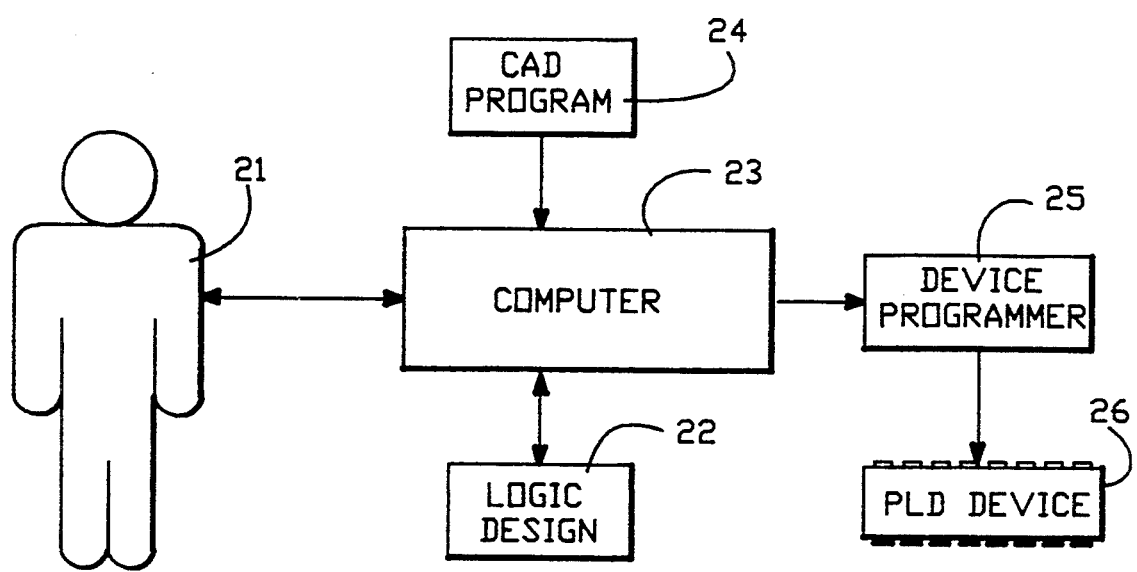
FIG. 1 is a block diagram, illustrating the interaction of various elements used to carry out the process of the present invention of configuring a PLD.

With reference to FIG. 1, the "machine" for carrying out the process of the present invention consists of many interacting elements. One of the elements, a human user 21, provides the programmable logic device (PLD) 26 to be programmed and specifies the logic function which the PLD 26 is to implement. Logic design software 22 and CAD software 24 operating in a computer 23 take the logic function specified by the user 21 and determine how to map the logic efficiently onto the PLD 26. Logic design software 22 is used to carry out the steps shown in FIGS. 5–14 and described further below, and if the specified function is represented in a schematic or high-level language format may also be used to transform the function from that format to a Boolean sum-of-products form prior to carrying out the steps in FIGS. 5–14. Such format transformation procedures are well known in the art and readily available. The procedure in FIGS. 5–14, however, is particular to the present invention. The CAD software 24 is used after the logic design software 22, and produces a bit-map file that indicates to a device programmer 25 the values to program into the PLD 26. This bit-map file, also known as a hex file, is a list of the programmable connections of the AND-array and OR-array of each functional block, of the logic expander or interconnect matrix, and other setting of the PLD 26. Typically, the bit-map file is in the "Intel Load Module" format known in the art. The device programmer 25 physically programs the contents of the bit-map file into the PLD 26. The physical form of the programming or configuring depends on the manufacturing technology of the PLD 26. If, for example, the PLD is an EPROM or EEPROM device, the EPROM or EEPROM cells are programmed by charging or discharging a floating gate or other capacitance element. Other PLD devices may be programmed by blowing fuses. One device programmer 25 that may be used is Shooter+ ™ from Logical Devices, Inc. It connects to computer 23 via an RS232 serial port. A software driver, such as Prolink ™ from Logical Devices, Inc., can download programs and data from the computer 23 to the device programmer 25. Thus, the interacting elements 21–25 of the machine in FIG. 1 carry out a process that reduces the PLD device from a useless unprogrammed state to programmed state that can carry out the specified function.

Figure 2:
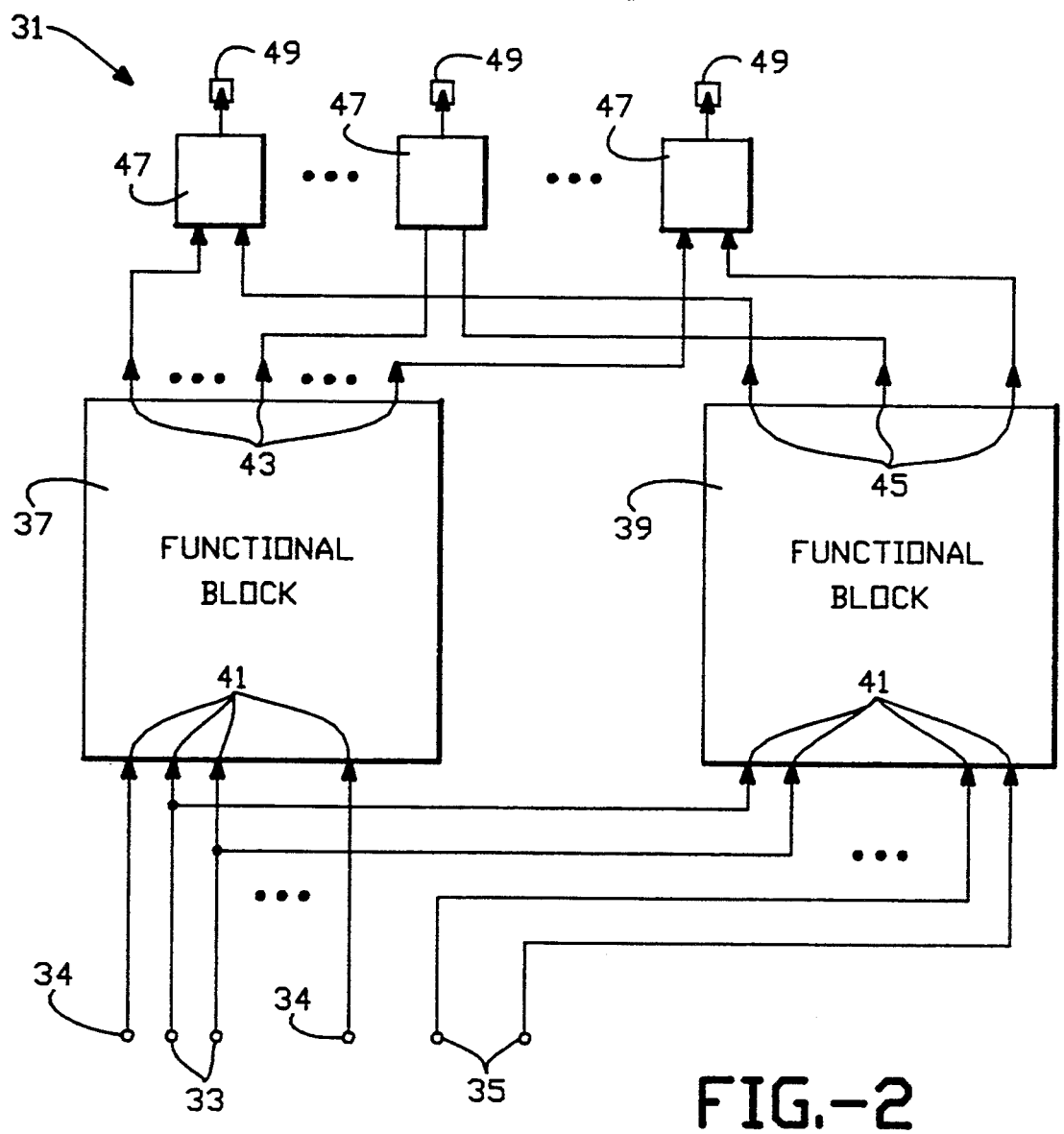
FIG. 2 is a block diagram of a type of three level logic PLD having logic expanders for carrying out a third level logic which may be programmed using the process of the present invention.

The PLD 26 is of the type having multiple functional blocks, each block having sets of inputs and outputs and a pair of successive configurable arrays for carrying out first and second levels of logic, and configurable means for connecting the outputs from the functional blocks in a third level of logic. One such PLD 31 is shown in FIG. 2. PLD 31 has a pair of functional blocks 37 and 39, each with inputs 41 and outputs 43. Each functional block 37 and 39 may be a programmable logic array (PLA) having a programmable AND-plane receiving inputs 41 to produce selected product terms followed by a programmable OR-plane collecting the product terms to produce outputs 43 and 45. Corresponding outputs 43 and 45 from each PLA 37 and 39 are combined by using logic expanders 47. Logic expanders 47 are typically programmable logic gates which carry out a selected logic function, such as logic AND. PLD 31 also has input pins 33–35 and output pins 49. Output pins 49 connect to the outputs of logic expanders 47. Input pins 33–35 connect to the inputs 41 of the functional blocks 37 and 39. Some input pins 34 may only connect to functional block 37, other input pins 35 may only connect to functional block 39, while some input pins 34 may be shared with both blocks 37 and 39.

Figure 3:
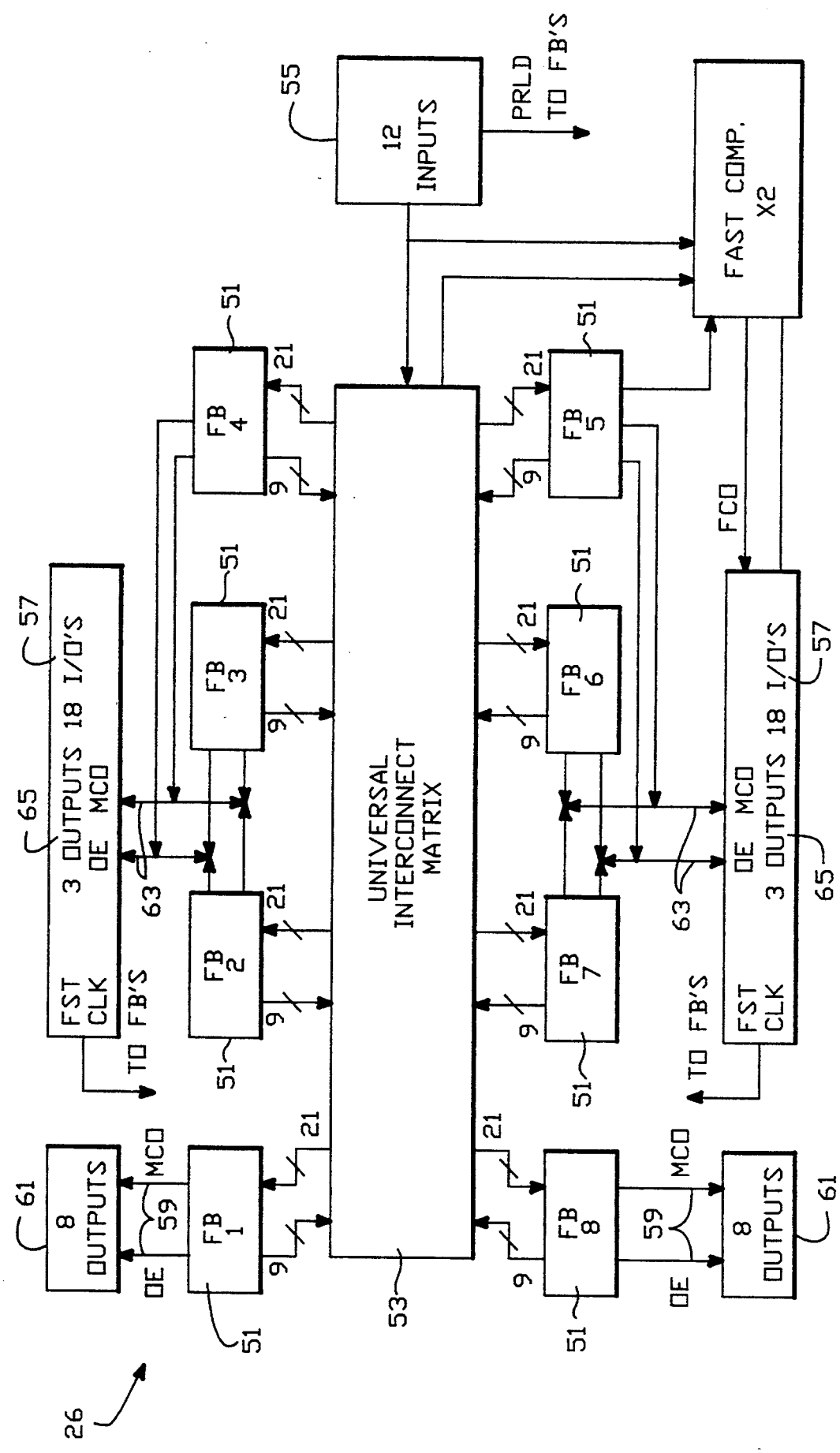
FIG. 3 is a block diagram of another type of three level logic PLD having a programmable interconnect matrix for carrying out a third level of logic which may be programmed using the process of the present invention.

With reference to FIG. 3, a preferred PLD structure for PLD 26 in FIG. 1 is that of the "FPGA2020" device of Pluslogic, Inc. shown in FIG. 3. The device includes a plurality of functional blocks 51, here eight in number. Each functional block has twenty-one inputs and nine outputs connected to a universal interconnect matrix 53. Twelve input pins 55 and thirty-six bidirectional (I/O) pins 57 also connect to the universal interconnect matrix 53. Two of the functional blocks 51 have output enable and macrocell output lines 59 connecting to nine output pins 61 each. Six of the functional blocks 51 have output enable and macrocell output lines 63 connect to six output pins 65 and the thirty-six bidirectional (I/O) pins 57, each of two sets of three blocks 51 sharing half of the pins. The numbers of each element given above are exemplary only and may be different for other PLD devices.

Figure 4:
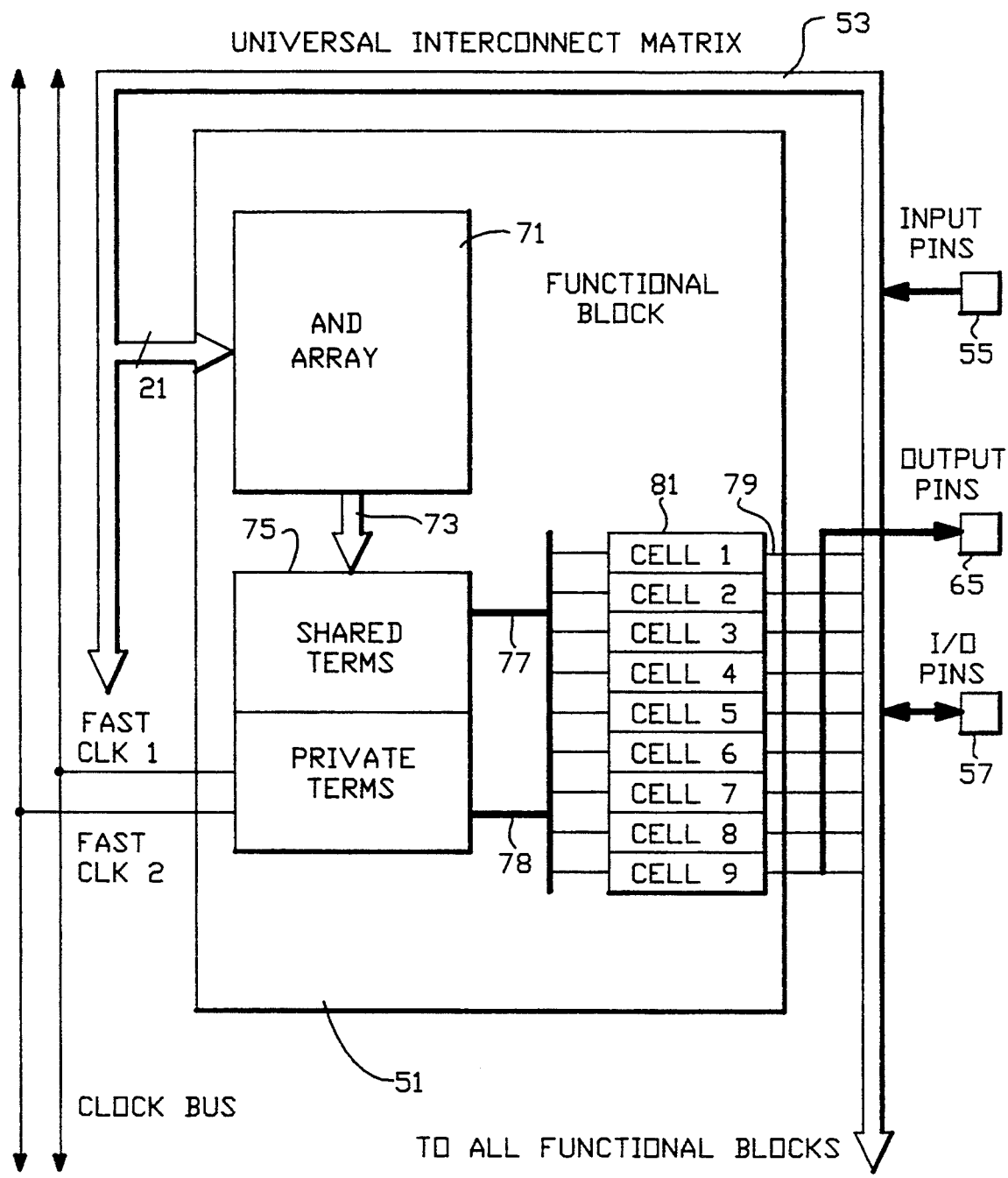
FIG. 4 is a block diagram of one of the plurality of functional blocks in the PLD of FIG. 3 which carry out first and second levels of logic.

With reference to FIG. 4, each functional block 51 may include an AND array 71 receiving twenty-one inputs from universal interconnect matrix 53 and producing product terms on outputs 73 of AND array 71. Each functional block 51 also includes an OR array 75 receiving product terms from AND array outputs 73 and collecting the product terms to produce outputs 77 and 78. Some or all of the outputs 77 may share output terms with the other outputs 77, while other outputs 78 can be dedicated to certain "private" output terms that are shared with no other outputs 77 or 78. Each functional block output 79 passes from the OR array outputs 77 and through macrocells 81 which typically permit latching or inverting of the outputs, or both. Functional blocks 51 provide two levels of logic, as represented by AND array 71 and OR array 75. The universal interconnect matrix is also configurable to provide a third level of logic in the form of a logic AND.

The determination of the best configuration in this process depends on the function specified being in sum-of-products form and factored into plural factors, also in sum-of-products form. Factorization of single output functions is a basic and well known operation of logic synthesis. Factoring of multiple output functions typically treats each output as a separate single output function. In either case, factoring will be performed if it reduces the circuit area required by that function.

Algebraic factorization is typically done by selecting a first factor, then computing the second factor by dividing the original function by the first factor. For example, $y=a*c+a*d+b*c+b*d$ can be factored into $y=(a+b)*(c+d)$. If configured in a PLD the first representation requires four product terms with two inputs each, while the second representation requires four product terms with one input each. The two factors in the second representation, namely $a+b$ and $c+d$ can be logically combined in a third level of logic which performs the logic AND (*) operation.

Boolean factorization and Boolean division take advantage of the properties of Boolean variables. Boolean variables can assume one of two complementary values, referred to as zero and one or as true and false. For example, the function $y=a*b*\bar{c}*d+a*b*\bar{e}*\bar{f}+c*d*\bar{a}*\bar{b}+c*d*\bar{e}*\bar{f}+e*f*\bar{a}*\bar{b}+e*f*\bar{c}*\bar{d}$ can be factored into $y=(a*b+c*d+e*f)*(\bar{a}*\bar{b}+\bar{c}*\bar{d}+\bar{e}*f)$. Here, the bar over an input variable represents the complement of that variable. When configured in a PLD, the first representation requires six product terms with four inputs each, while the second representation requires six product terms with two inputs each. The two factors in the second representation can be combined in a third level of logic which performs the logic AND operation.

The process of Boolean division is as follows. Given a function f and a divisor g, we wish to find a quotient q and a remainder r, such that $f=q*g+r$. We introduce a variable z for the divisor g. Since in Boolean logic, $\bar{z}*g+\bar{z}*g$ cannot be true, we can minimize the resulting equation $f=q*z+r$, specifying $-\bar{z}*g+z*\bar{g}-$ as the don't care set. A known minimizer program, such as Espresso, can be used for minimization, provided the expansion step of the minimizer carries out an expansion of z only after all other variables to ensure that z remains in the result. Algebraic division by z is the final step.

As noted above, factorization is typically carried out on each output separately. However, this does not necessarily result in the most efficient representation of a multiple output function. A novel multi-output factorization procedure can be used with the present invention:

```
Procedure 1 (Main procedure)
Given: A multiple output function.
Output: PLA1 and PLA2.
Apply "optimum phase assignment" on the onset.
PLA1 = t_PLA = onset.
PLA2 = universal product term.
best_cost = number of product terms in PLA1 and
PLA2 together.
while (t_PLA has at least two product terms) {
    reduce_PLA(t_PLA, offset, best_PLA1,
    best_PLA2, cost).
    if (cost < best_cost) {
        best_cost = cost.
        PLA1 = best_PLA1.
        PLA2 = best_PLA2.
    }
}
Apply "optimum phase assignment" on PLA1.
Apply "optimum phase assignment" on PLA2.
Get the functionality of each logic expander
using results of phase assignments
on the onset, PLA1 and PLA2 done above.
Procedure 2 (Reduce the size of the given PLA by
1 product term)
Given: The PLA (called t_PLA) and the offset of a
multiple output function in sum-of-products
form.
Output: reduced t_PLA which has one less row than
t_PLA, best_PLA1, best_PLA2 and a parameter
called best_cost.
reduce_PLA(t_PLA, offset, best_PLA1, best_PLA2,
best_cost) {
    best_cost = INFINITY.
    for each product term p in t_PLA {
    for each product term q other than p in t_PLA {
        temp = super-cube of p and q.
        Remove p and q from t_PLA.
        Add temp to t_PLA.
        PLA1 = t_PLA.
        R2 = intersection of PLA1 with the offset.
        PLA2 = onset.
        PLA2 = expand(PLA2, R2).
        R1 = intersection of PLA2 with the offset.
        PLA1 = expand(PLA1, R1).
        cost = number of rows in PLA1 and PLA2
        together.
        If (cost < best_cost) {
            best_PLA1 = PLA1.
            best_PLA2 = PLA2.
            reduced_t_PLA = t_PLA.
            best_cost = cost.
        }
        Remove temp from t_PLA.
        Put p and q back into t_PLA.
    }
}
t_PLA = reduced_t_PLA.
```

In the program listed above, the "optimum phase assignment" operation is one which, given a multiple output function F, finds a different multiple output function F' with the same number of inputs as F, such that there is a subset of outputs where for any input assignment, F' produces a value 0 when F produces a value 1 and F produces a value 1 when F produces a value 0. The "offset" of a multiple output function f is a multiple output function g with the same number of inputs and outputs as f, such that the output pattern produced by g is a complement of that produced by f. If it is assumed that there is no "don't care" set in a function f, then the function f itself is the "onset" of f. The "universal product term" is a product term which contains no input term or "literal" in the input part and has all outputs of value 1 in the output part. Each output is true regardless of the inputs, i.e. for all possible input assignments.

The main procedure essentially begins by assigning the original function as a factor to one logical functional block and the universal product term as a factor to another functional block. The "cost" or number of product terms in both blocks is determined. Then using the procedure "reduce PLA" the size of the factor in the first functional block is reduced one product term at a time to identify the pair of factors having the minimum total number of product terms. The "super cube" of two product terms is a product term where the input part consists only of those input terms which are present in the input parts of both product terms and the output consists of outputs which are present in either product term. This is the smallest product term that contains or covers the two product terms. The "intersection" of two product terms, if it is not null, is a product term whose input part consists of input terms that are present in either product term and whose output part consists of outputs common to both product terms. It is null if no input assignment exists which can result in a value 1 at the same output of both product terms, as for example, where no output is common to both product terms or where one product term has an input term whose employment is in the other product term.

The "intersection of two sum-of-products" F1 and F2 is another sum-of-products whose product terms are the intersections of all possible pairs of product terms chosen one from F1 and the other from F2. The expand (F,R) operation, given a sum-of-products F, finds a different sum-of-products F' by removing input terms and product terms from F, such that the intersection of F' with R is null.

Example

Consider the sum-of-products for a multiple output function with 8 inputs and 2 outputs shown below:

| | |
|---|---|
| 0011---- | 11 |
| 1100---- | 11 |
| 00--11-- | 11 |
| --0011-- | 11 |
| 11--00-- | 11 |
| --1100-- | 11 |
| 00----11 | 10 |
| --00--11 | 10 |
| ----0011 | 10 |
| 11----00 | 10 |
| --11--00 | 10 |
| ----1100 | 10 |

Each row in the above format represents a product term. The first eight columns represent the input part of the product term. Each column corresponds to an input. A 1 (0) in a given row and column means that the product term corresponding to the row contains the asserted (complemented) literal of the input that corresponds to the column. A —means the input is not present in the product term. The last two columns represent the output part of the product term. Suppose that the first eight columns correspond to the inputs named A, B, C, D, E, F, G and H and the last two to outputs O1 and O2. The row "—00—11 10" represents a product term which has complement literals of inputs A and B and asserted literals of inputs G and H. The inputs C, D, E and F are not present in the product term. The product term has output O1 but not O2.

It can be shown that the sum-of-products given above is the one with the smallest number of product terms. Therefore a single PLA implementation will have 12 rows. The offset for the above function is given below:

| | |
|---|---|
| 1-1-1-1- | 11 |
| -11-1-1- | 11 |
| 1--11-1- | 11 |
| -1-11-1- | 11 |
| 1-1--11- | 11 |
| -11--11- | 11 |
| 1--1-11- | 11 |
| 0-0-0-0- | 11 |
| -00-0-0- | 11 |
| 0--00-0- | 11 |
| -0-00-0- | 11 |
| 0-0--00- | 11 |
| -00--00- | 11 |
| 0--0-00- | 11 |
| 1-1-1--1 | 11 |
| -11-1--1 | 11 |
| 1--11--1 | 11 |
| -1-11--1 | 11 |
| 1-1--1-1 | 11 |
| -11--1-1 | 11 |
| 1--1-1-1 | 11 |
| 0-0-0--0 | 11 |
| -00-0--0 | 11 |
| 0--00--0 | 11 |
| -0-00--0 | 11 |
| 0-0--0-0 | 11 |
| -00--0-0 | 11 |
| 0--0-0-0 | 11 |
| 1-1-1--- | 01 |
| -11-1--- | 01 |
| 1--11--- | 01 |
| 0-0-0--- | 01 |
| -00-0--- | 01 |
| 0--00--- | 01 |
| 1-1--1-- | 01 |
| -11--1-- | 01 |
| 1--1-1-- | 01 |
| 0-0--0-- | 01 |
| -00--0-- | 01 |
| 0--0-0-- | 01 |
| 0101---- | 01 |
| 1010---- | 01 |
| 010101-- | 11 |
| 101010-- | 11 |

The output phase assignment in the main procedure did not find a different multiple output function. PLA1 and t_PLA are made equal to the onset. PLA2 is set to the universal cube "—11". Since there are 12 product terms in PLA1 and 1 in PLA2, best_cost is 13.

Since t_PLA has 12 product terms initially, the while-loop is entered. The call to reduce_PLA returns best_PLA1 and best_PLA2 with cost=8. The operations in reduce_PLA for this example are explained below. Since this cost is lower than the previous best_cost of 13, best_PLA1 and best_PLA2 are saved and the best_cost becomes 8. No further iterations of the while loop produces a better solution.

Applying output phase assignment to PLA1 and PLA2 individually does not change either of them. Finally, each logic expander is used as an "AND" function.

Reduce_PLA is called for the first time with t_PLA=onset. After setting best_cost to infinity, the nested for-loop is entered. Several iterations are made of the loop. In one of these iterations, p=11—00—11 and q=—1100—11. The super-cube of p and q is "—0-0—11". When p and q are removed from t_PLA and temp is added to it, t_PLA becomes:

| | |
|---|---|
| 0011---- | 11 |
| ----00-- | 11 |
| 00----11 | 10 |
| ----0011 | 10 |
| 11----00 | 10 |
| --11--00 | 10 |
| 1100---- | 11 |
| 00--11-- | 11 |
| --00--11 | 10 |
| ----1100 | 10 |
| --0011-- | 11 |

After setting PLA1 to the above t_PLA, R2 is computed as the intersection of PLA1 and the offset. This intersection is:

| | |
|---|---|
| 0-0-000- | 11 |
| -00-000- | 11 |
| 0--0000- | 11 |
| -0-0000- | 11 |
| 0-0-00-0 | 11 |
| -00-00-0 | 11 |
| 0--000-0 | 11 |
| -0-000-0 | 11 |
| 0-0-00-- | 01 |
| -00-00-- | 01 |
| 0--000-- | 01 |
| 010100-- | 01 |
| 101000-- | 01 |

Each product term in the above intersection is the result of intersecting one product term from PLA1 with one from the offset. For example "0—0—000—11" is the intersection of" —00—11" in PLA1 with "0—0—0—011" in the offset. Since there are 11 product terms in PLA1 and 44 in the offset, there are 484 pairs of cubes with one product term from each of PLA1 and the offset. However, if the intersection of the pair is null, it does not contribute a product term to the offset. Also, if the intersection of two or more pairs is the same product-term, it appears only once in R2. For example "0—0—000—11" is also the intersection of "—00—11" in PLA1 with "0—0—00—11" in the offset. This is why the number of product terms in R2 is much smaller than the number of possible pairs.

The next step in reduce_PLA is to initially set PLA2 to the onset and use the expand operation to obtain a better PLA2. PLA2 obtained in this case is:

| | |
|---|---|
| ------11 | 10 |
| ----11-- | 11 |
| --11---- | 11 |
| 11------ | 11 |

Next, R1 is obtained as the intersection of PLA2 with the offset and PLA1 is improved by the expand operation. PLA1 thus obtained is:

| | |
|---|---|
| ------00 | 10 |
| ----00-- | 11 |
| --00---- | 11 |
| 00------ | 11 |

The cost of this solution is 8 which is considerably less than the cost of the best solution possible using only one PLA (12). No other iteration of the nested for-loop finds a better solution. Therefore, PLA1 and PLA2 obtained above are returned as the best solution.

Figure 5:
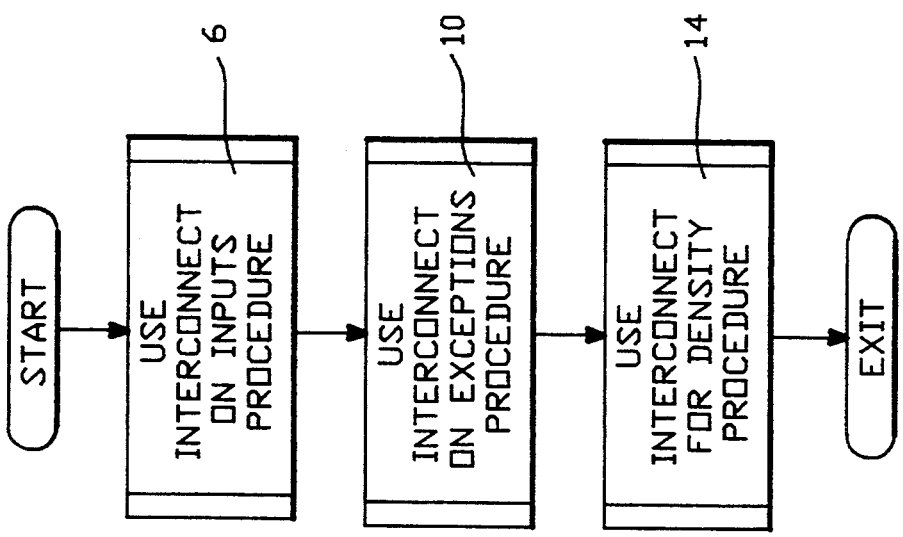
FIG. 5 is a flow diagram of a procedure in the process of the present invention for determining how to configure the device to carry out a specified logic function.

With reference to FIG. 5, the logic design software 22 in FIG. 1 determines how best to fit a specified function into a PLD 26 of the type just described by using the steps of the procedure shown. The procedure starts with a function or factors in sum-of-products form and performs (1) a "use interconnect on inputs" procedure 6, (2) a "use interconnect on exceptions" procedure 10, and (3) a "use interconnect for density" procedure 14. Control then exits to the CAD program 24 in FIG. 1 for generating the bit-map file. The "use interconnect on inputs" procedure 6 tries to simplify the logic function so that it requires fewer inputs or product terms or both. It does this, assuming that functional block inputs come from an interconnect matrix, using the matrix as an AND array to combine input signals before they go into the functional blocks. This procedure is described in greater detail below in FIGS. 6-9. The "use interconnect on exceptions" procedure 10 tries to handle individual output functions that have too many inputs or product terms to fit within one functional block. This procedure is described in greater detail below in FIGS. 10-13. The "use interconnect for density" procedure 14 attempts to produce an efficient mapping, whenever a functional block with used up or nearly used up input or product term resources still has unused outputs, by splitting up the most costly output functions to use multiple output cells and recombining them in the interconnect matrix. This procedure is described in greater detail below with reference to FIG. 14.

Figure 6:
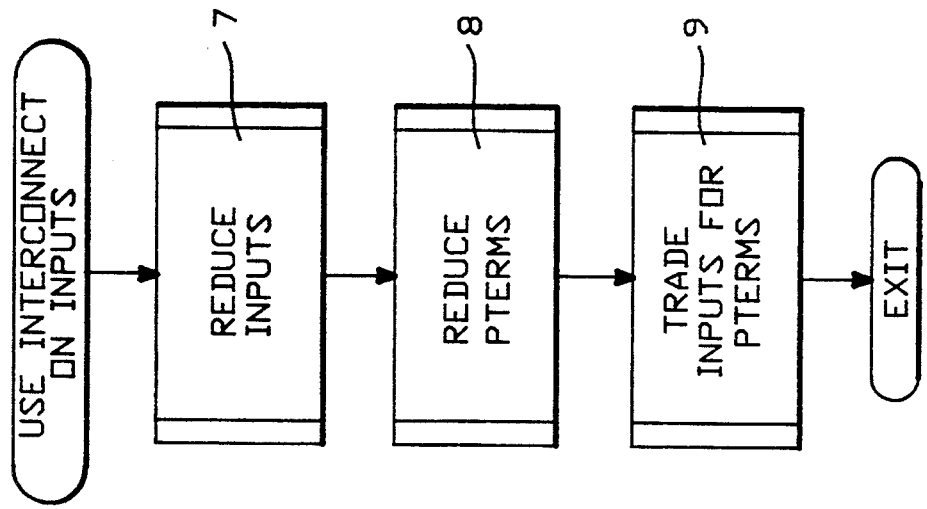
FIGS. 6–14 are flow diagrams detailing steps in the procedure of FIG. 5.

With reference to FIG. 6, the "use interconnect on inputs" procedure comprises three basic steps: the "reduce inputs" step 7, the "reduce product terms" step 8 and the "trade inputs for product terms" step 9. The reduce inputs step 7 selects pairs of inputs, such that combining them in an interconnect matrix will reduce the number of inputs into the functional blocks. For example, a function or factor $x=a*b*c+a*b*d$ has four inputs, identified as a, b, c and d. If a and b are combined in the interconnect matrix performing a logic AND, then only three inputs, identified as a*b, c and d are required. The reduce product terms step 8 selects pairs of inputs, such that combining them in an interconnect matrix will reduce the number of product terms in the functional blocks. For example, a function or factor $x=a*\bar{c}+a*\bar{d}+b*c$ has three product terms, identified as $a*\bar{c}$, $a*\bar{d}$ and $b*c$. Combining $c*d$ in the interconnect matrix to form an input term z, rewrites the function or factor $x=a*\bar{z}+b*c$. This requires only two product terms. The trade input terms for product terms step 9 determines whether input terms or product terms are more constrained than the other. If input terms are used up in a functional block faster than product terms, then one can use the reduce inputs step 7 to save inputs at the expense of product terms.

Figure 7:
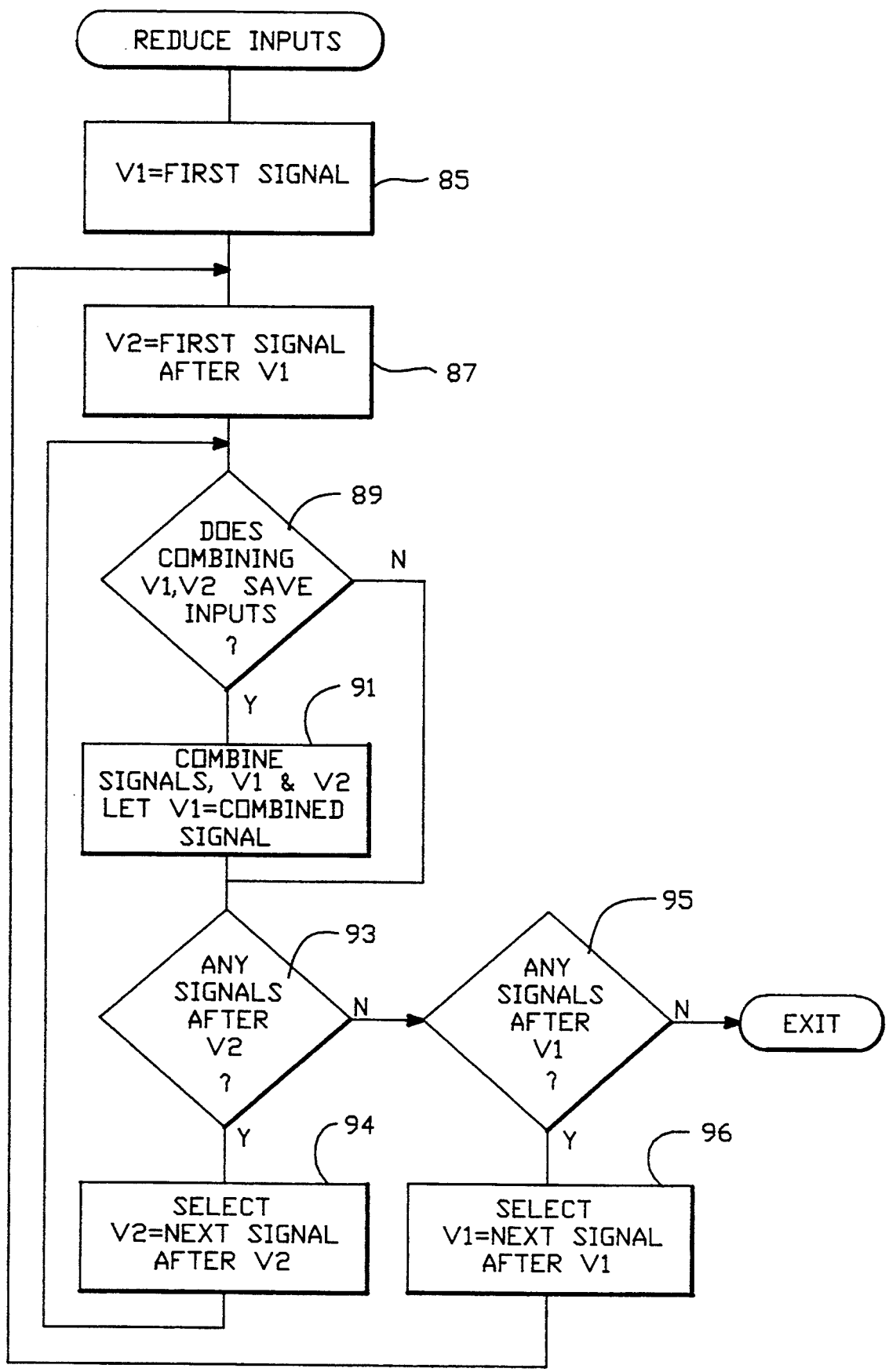

In FIG. 7, the reduce input terms step 7 comprises selecting a first input term and labeling it V1 (step 85), selecting a next input term and labeling it V2 (step 87).

If combining V1 and V2 reduces the overall number of input terms in the function or factor (step 89), then input terms V1 and V2 are combined and redesignated as V1 (step 91). The steps are then repeated for other input terms after that which was labeled V2 (steps 93 and 94) and compared with the redesignated V1. The steps are also repeated for pairs of signals after V1 (steps 95 and 96). In this way all pairs of inputs are considered for their effect on the number of input terms.

Figure 8:
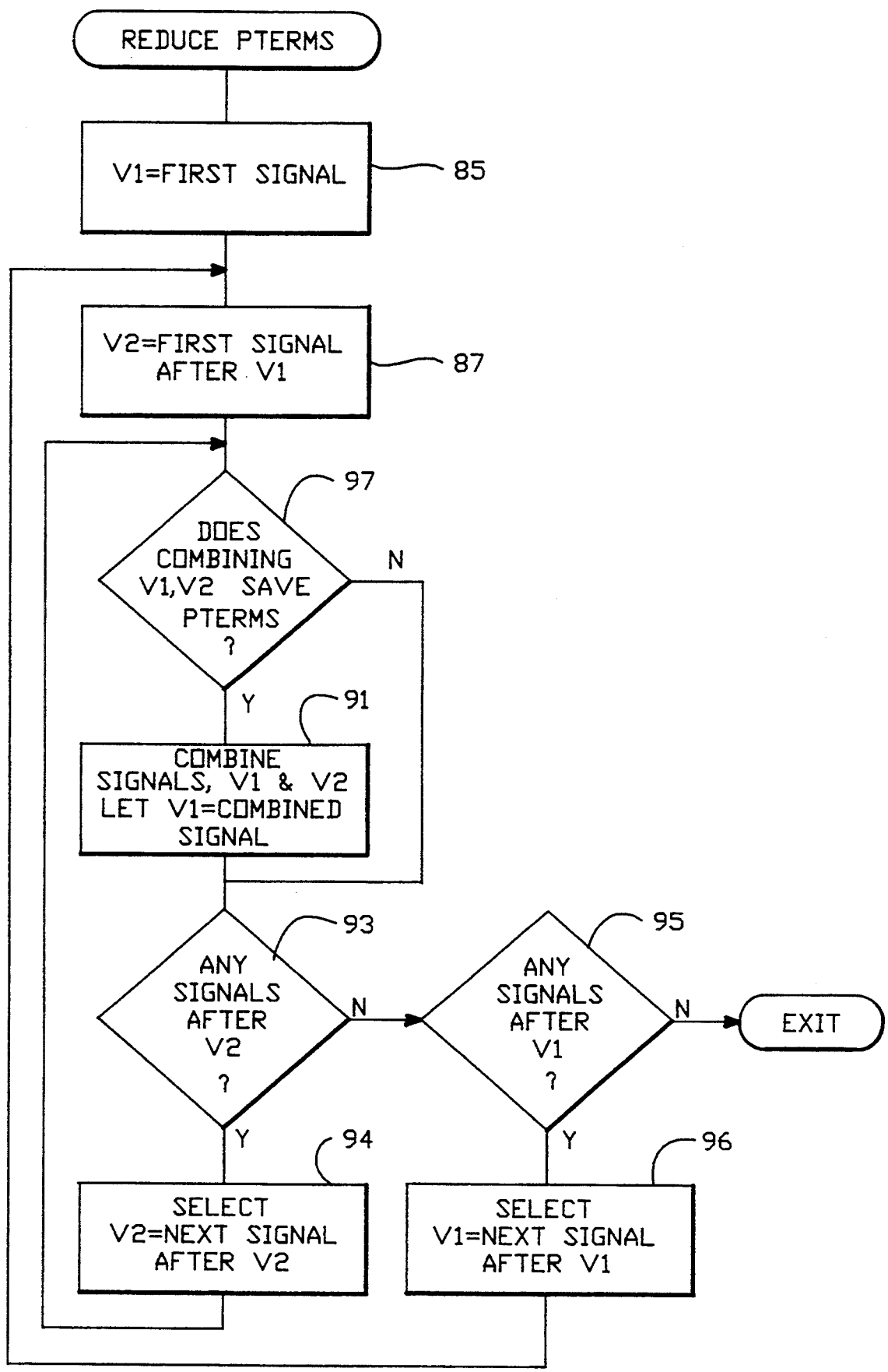

In FIG. 8, the reduce product terms step 8 is identical to the reduce input terms step 7, except terms labeled V1 and V2 are checked to see whether combining them reduces the overall number of product terms in a function or factor without increasing the number of inputs (step 97). The other steps 85, 87, 91, 93-96 are the same.

When doing either comparison step 89 or 97 in FIGS. 7 or 8, if a PLD is programmable to selectively invert inputs prior to entering the interconnect matrix, one can also consider the complement of each combined pair of input terms. For example, a function or factor $x=a*\bar{b}*c+a*\bar{b}*d$ can be reduced to $x=z*c+z*d$, where z is an input term formed by combining $a*\bar{b}$, inverting the term b before input into the interconnect matrix. The function or factor $x=a*c+a*\bar{d}+b*c$ can be reduced to $a*\bar{z}+b*c$, where $z=\bar{c}*d$ is formed by inverting the term c before input into the interconnect matrix and logically ANDing it to term d. The first example has fewer inputs, the latter has fewer product terms without increasing the number of inputs. Comparison of terms in steps 89 or 97 may be done by a quick algebraic method which compares every pair of signals in every product in its original form or a slower, but more efficient, Boolean method may be used which uses Boolean division to divide the original function by pairs of inputs to see if those inputs disappear from the quotient. For example, if the function or factor $x=a*b*c+d*\bar{a}+d\bar{b}$ is divided by the combined pair a*b, then $x=c*z+d*\bar{z}$. Both the number of inputs and the number of product terms are reduced, so the combination would be made in FIG. 7, step 91.

Figure 9A:
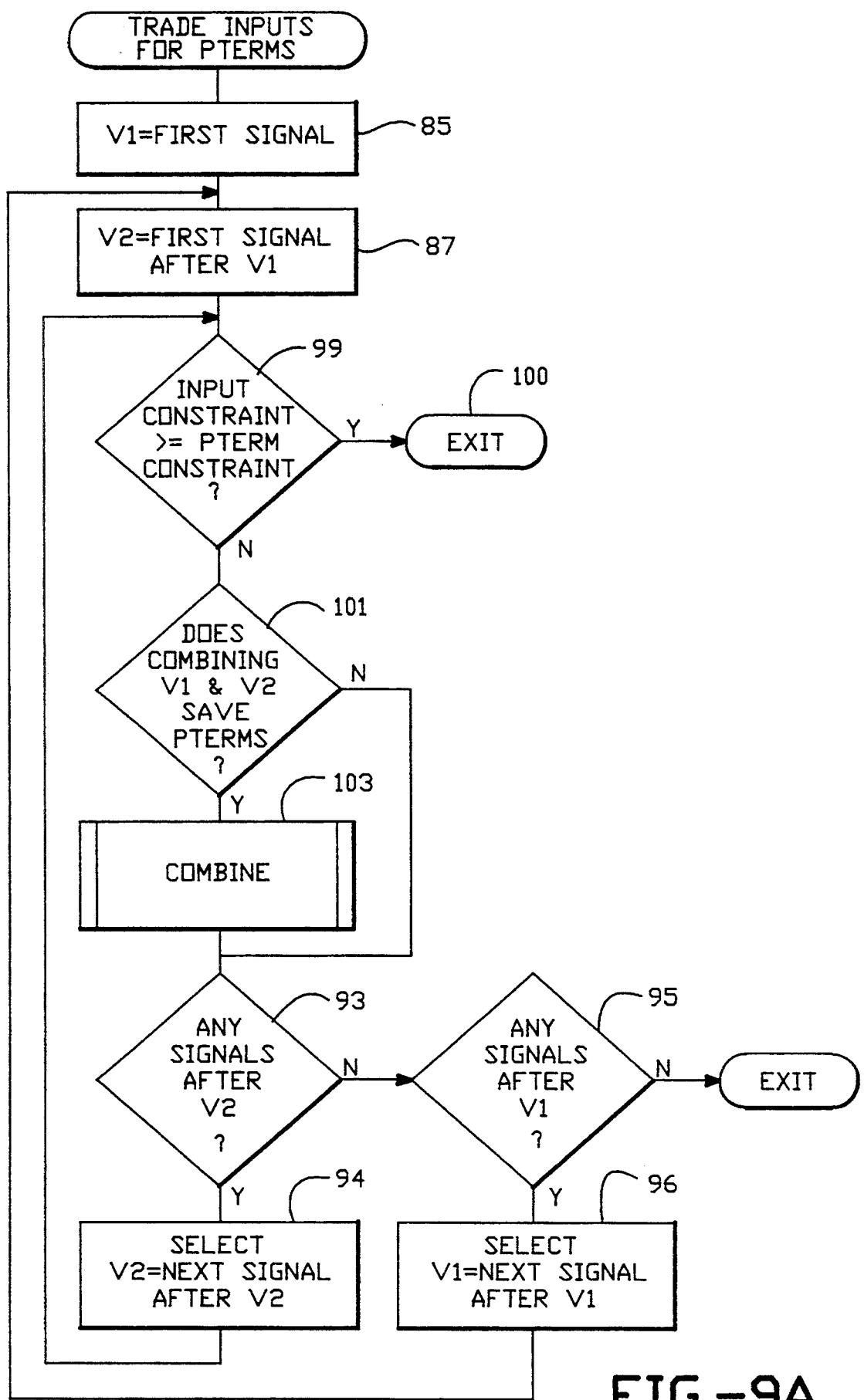
Figure 9B:
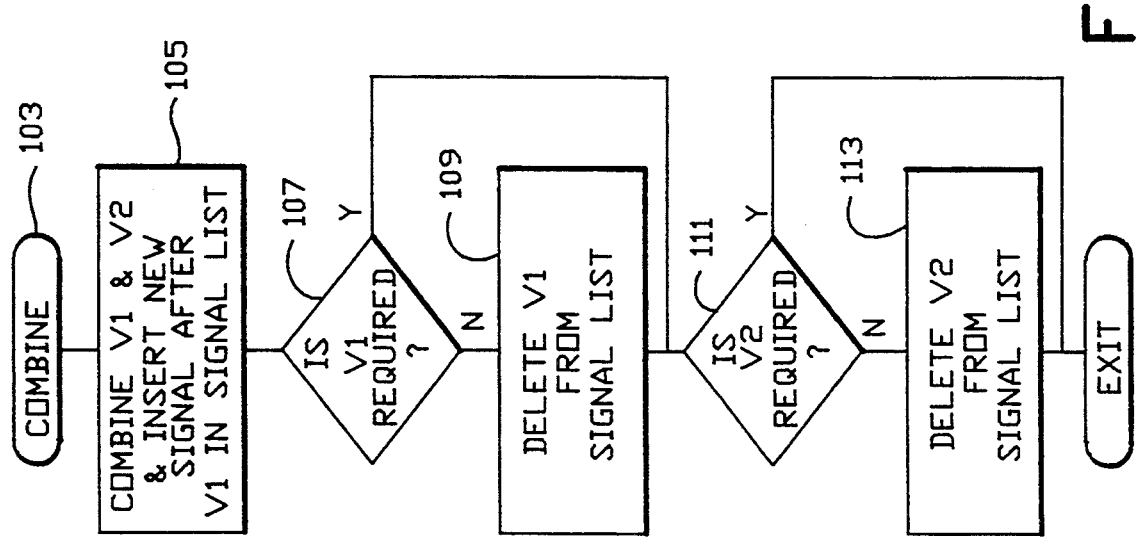

With reference to FIG. 9, the trade inputs for product terms step 9 proceeds in the selection of pairs of terms, exactly as in FIGS. 7 and 8 with steps 85, 87, and 93-96. However, here the interest is in determining whether product terms are constrained in the functional block and, if so, reducing product terms even at the expense of some input terms. The input constraint is defined as the number of input terms in a function or factor after the latest combining step divided by the maximum number of input terms available in a functional block. The product term constraint is defined as the number of product terms in a function or factor after the latest combining step divided by the maximum number of product term lines available in a functional block. If the input constraint is determined to be greater (step 99), then no trading is required, since input terms have already been maximally reduced, and the procedure is exited (step 100). If the product term constraint is greater, then if combining the pair of terms under consideration reduces the number of product terms (step 101) then one may combine them even if the number of input terms increases (step 103).

Figure 10:
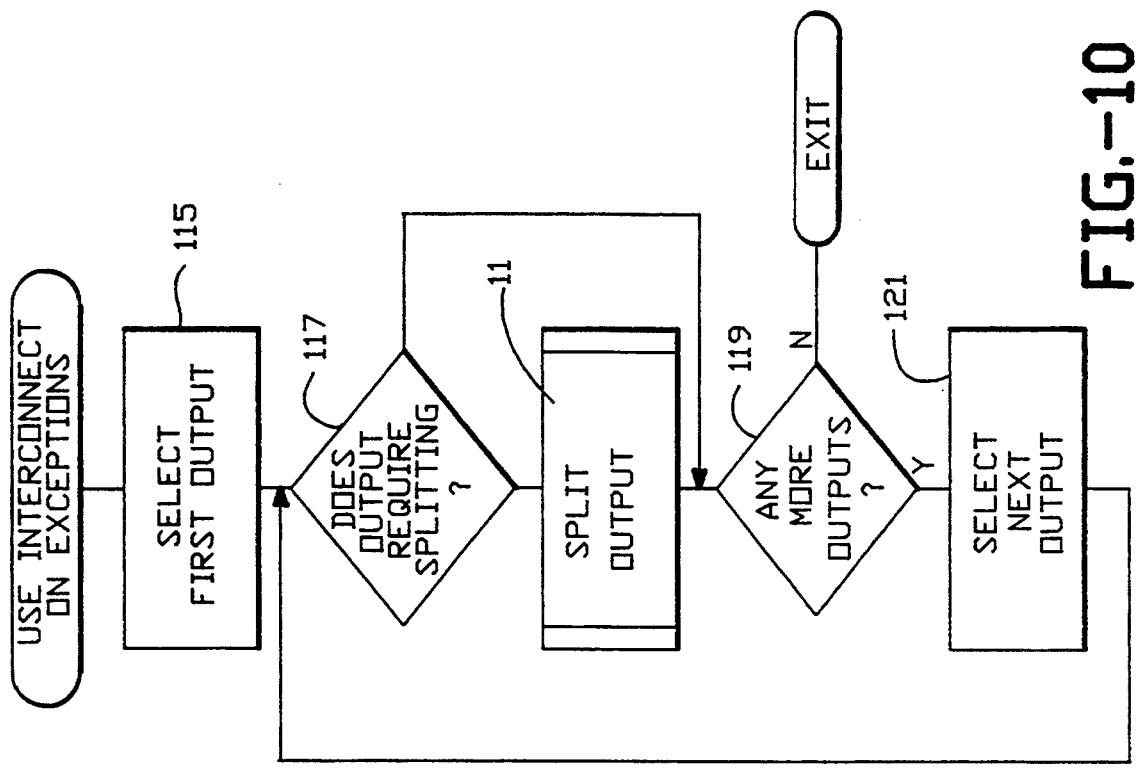

With reference to FIG. 10, the use interconnects on exceptions procedure 10, following the use interconnects on inputs procedure 6, just discussed with reference to FIGS. 6-9, comprises selecting an output of a function or factor (step 115) and determining if the inputs or product terms required by that output exceeds the maximum available in a single functional block (step 117). If so, then the output function requires splitting and assignment into two or more subfunctions. After splitting the output (step 11) as described with reference to FIGS. 11–13 below, if there are more outputs (step 119) then the next output is selected for consideration (step 121) and determining step 117 is repeated. After splitting individual output functions into subfunctions, each subfunction is mapped into an output cell in one or more functional blocks.

Figure 11:
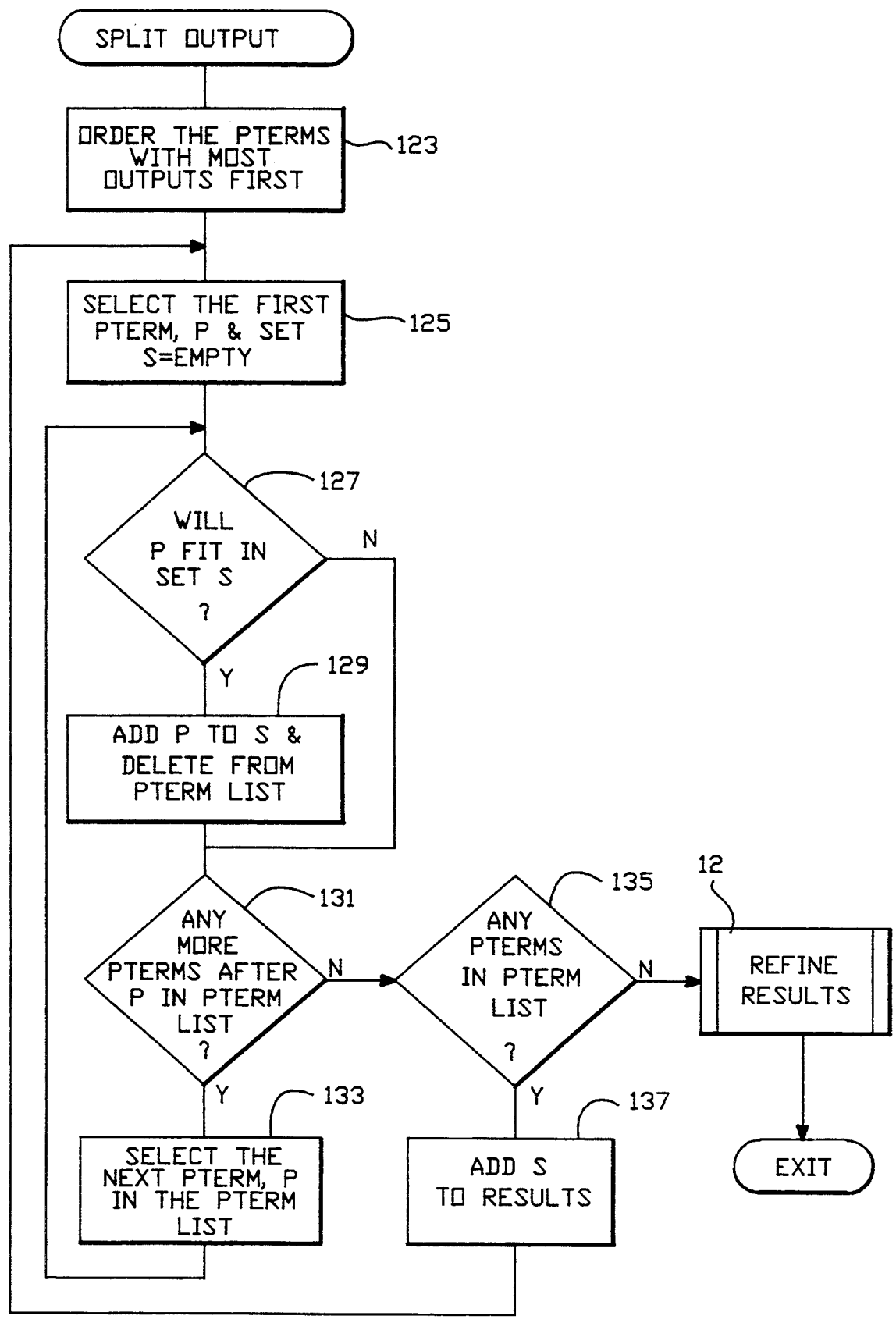

In FIG. 11, splitting an output may be accomplished using OR factorization, i.e. by separating product terms. First, the product terms are ordered according to the number of inputs they have, from largest to smallest (step 123). The first, i.e. the largest, product term p is selected and a set S is designated to represent a subfunction that is initially empty (step 125). If the product term p will fit in set S, i.e. does not exceed the number available inputs in the functional block, it is assigned to set S (steps 127 and 129). If product term p is too large one can display an error message and give up. Alternatively, one may use the use interconnect on inputs procedure described above to combine its most infrequently used inputs in the interconnect until the product term will fit in the function block represented by set S. Alternatively, before ordering the product terms one could look for the existence of any algebraic kernels to factor the function into two subfunctions or factors each with fewer inputs and product terms. The Boolean factorization technique described above could also be used.

After assigning the first product term to set S, the next largest product term in the list, if any, is selected (step 133) and the fit checking and assignment steps are repeated (steps 127 and 129). Assignment continues as long as all of the product terms assigned to set S do not together exceed the number of inputs and product terms available to the functional block. If set S is full and there are other product terms remaining (step 135), the set S is added to the assignment results (step 137) and a new set is selected (step 115 repeated) for the product terms still in the list. Once all product terms have been assigned to subfunctions, one could refine the results (step 12) further as described with reference to FIGS. 12 and 13. Other outputs are considered in a similar way.

Figure 12:
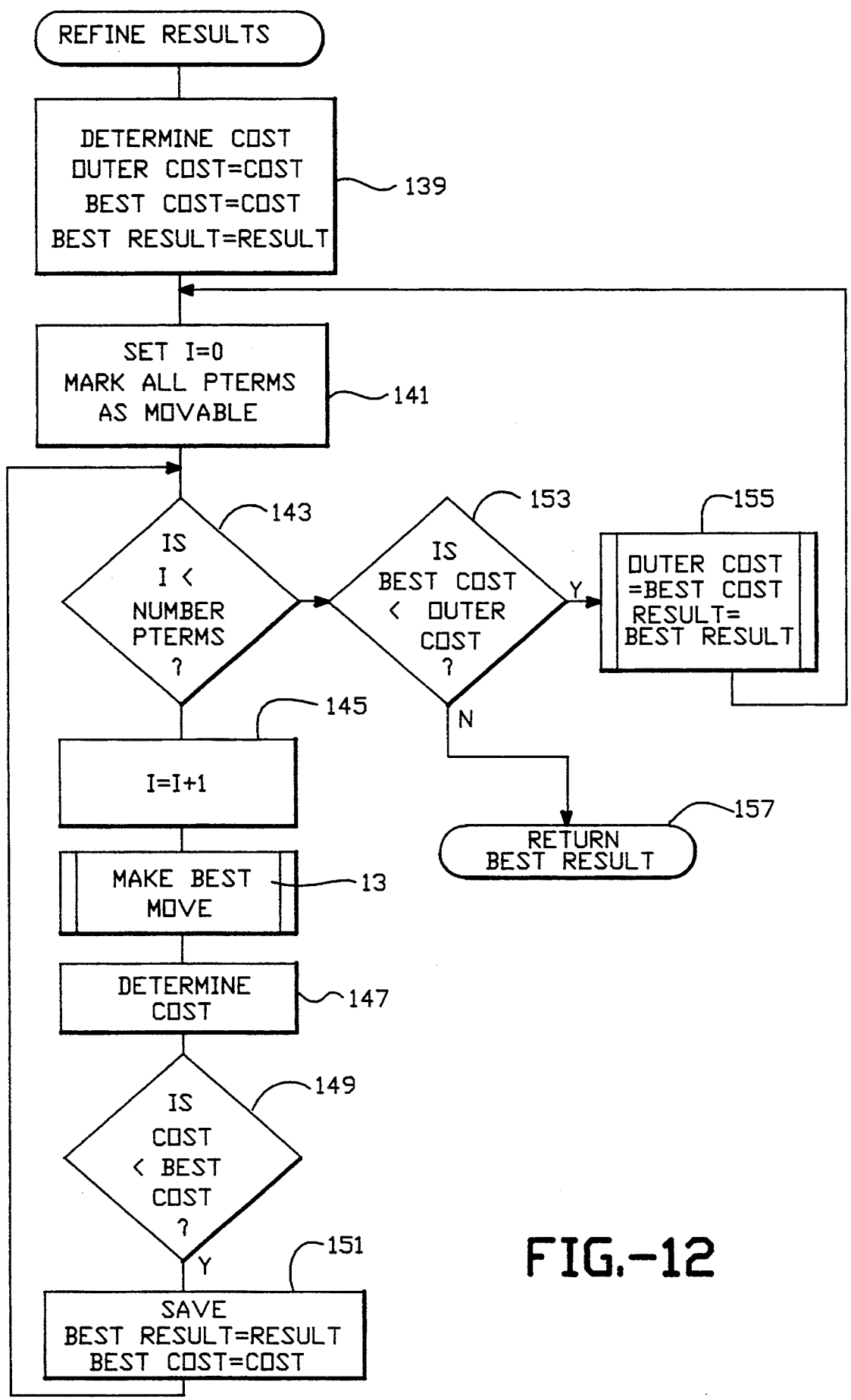

In FIG. 12, assignment results of an output's product terms to subfunctions can be refined. To carry out this refinement, the cost of the current assignment is determined, designated "outer cost", and initially designated as the best cost, while the assignment result is designated initially as the best result (step 139). The cost of an assignment is the sum total of the number of inputs for each set in that assignment. Basically, the refinement looks to see if swapping product terms from one set to another reduces the cost. All product terms are considered to be movable and each is labeled as such (step 141). An index I runs a best move step 13 until moving the last product term has been tried (steps 143 and 145). Each time a best move is made (step 13) the cost of the proposed assignment is determined (step 147) and compared against the best cost found so far (step 149). If it is better than previous proposed assignment results then the assignment is designated as the best result and the best cost is designated as the cost of that assignment (step 151). Once best move step 13 has been carried out on the last product term in the list, the best cost is compared to the "outer cost" (step 153) and if no improvement has yet been achieved the refinement procedure is repeated (step 155). Once improvement has been made the best result is used as the product term assignment to the subfunctions.

Figure 13:
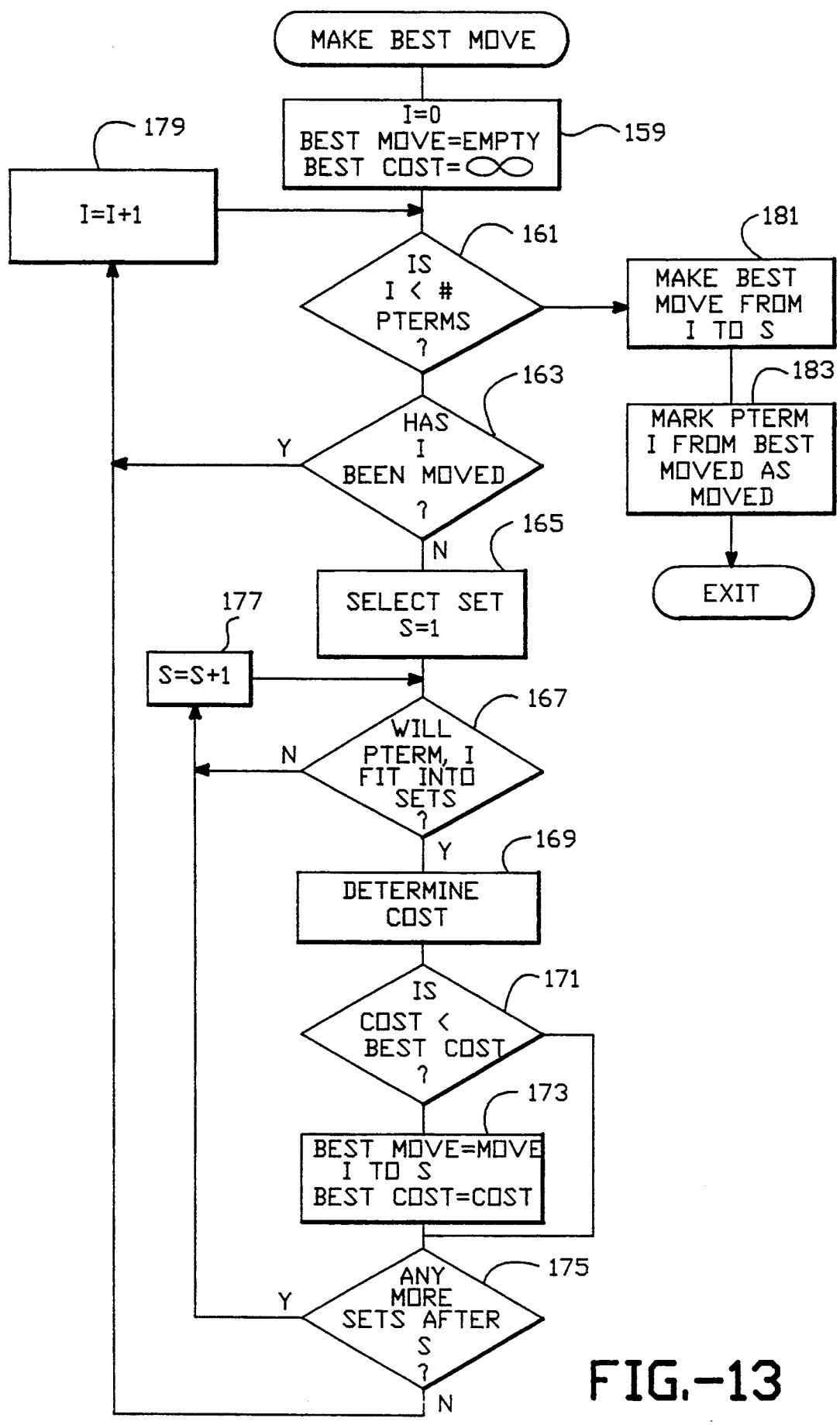

The best move step 13, shown in FIG. 13, assigns a space for storing a best move and the cost of that move and resets an index I to zero (step 159). Then, as long as the index I is less than the number of product terms in the output (step 161), asks whether the $I^{th}$ product term has been moved yet (step 163). If not, then starting with a first assignment set representing a subfunction (step 165), asks whether that product term fits in the set (step 167), determines what the cost of moving the product term to that set would be (step 169) and asks whether that cost is less than best cost achieved so far in this run of the best move step 13 (step 171). If the cost is less than the best cost, then this best move of product term I to set S and its cost are recorded (step 173) and another set is tried until the sets are exhausted (steps 175 and 177). After all sets have been tried with product term I, the index I is incremented and the process proceeds in trying to move the next product term (steps 179 and 161). Once all product terms have been tried the best move is made (step 181) and the product term moved is marked as such (step 183). Control then proceeds back to cost determination (step 147) in FIG. 12.

At the end of the use interconnects on exceptions procedure 10, each individual output function will have been assigned into one or more functional blocks. The separate outputs are recombined in the interconnect matrix by making use of the Boolean property that $\overline{A}+\overline{B}=\overline{A \cdot B}$. According a split function's separate outputs are ordinarily inverted prior to being combined in the interconnect matrix, and the complement of the function is arrived at by using the interconnect matrix to logically AND the inverted outputs. The output of the interconnect matrix is inverted to get the function. However, one can decide against inversion if the complement of the output logic function requires fewer product terms.

Figure 14:
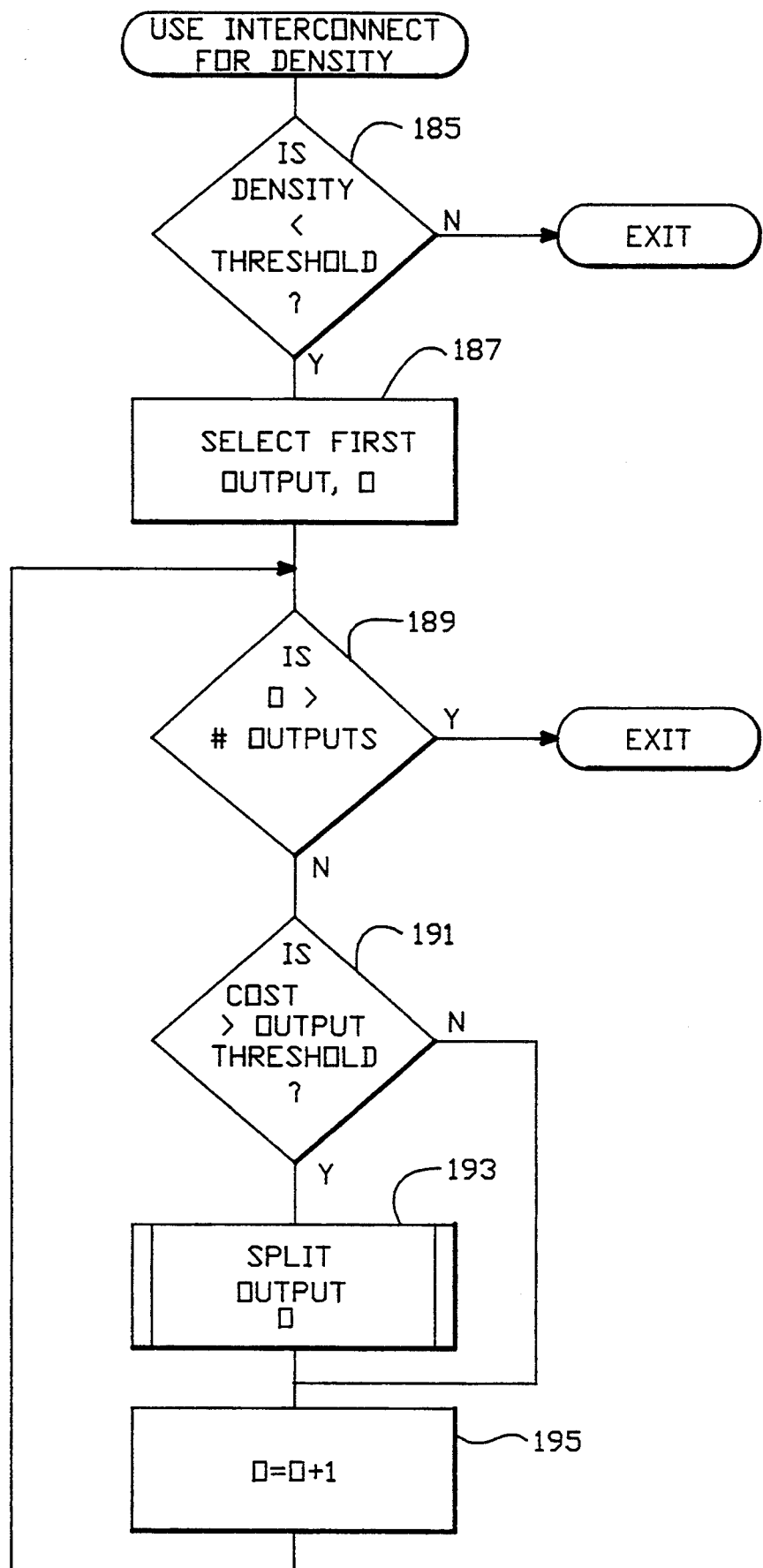

With reference to FIG. 14, the use interconnect for density procedure 14 considers that if any functional block has used up or nearly used up its input term or product term resources and still has unused outputs, then one should split the most costly output functions in terms of inputs or product terms or both, in the manner similar to the use interconnect on exceptions procedure 10, and reassign the split terms to different functional blocks to improve resource utilization.

For example,

The FPGA 2020 has 8 functional blocks, FB1, FB2, . . . FB8.

Each block has 21 inputs and 9 outputs.

Each block provides 4 product terms dedicated to each output.

Each block has 12 product terms that can be shared between all 9 outputs.

Consider 8 equations:

$$x1 = a1*a2*a3 + a4*a5*a6 + \ldots + a19*a20*a21$$

$$x2 = a2*a3*a4 + a5*a6*a7 + \ldots + a20*a21*a22$$

$$x8 = a8*a9*a10 + a11*a12*a13 + \ldots + a26*a27*a28$$

One can only fit one equation into each functional block. Each equation has 21 inputs and any combination of equations requires more than 21 inputs in total. This means that only one of the nine outputs in each block is utilized.

In this example we would split the most costly equation. As each equation has the same number of inputs and product terms we select the first, x1. We split x1 into two equations x1a and x1b as follows:

$$x1a = a1*a2*a3 + a4*a5*a6 + a7*a8*a9 + a10*a11*a12$$

$$x1b = a13*a14*a15 + a16*a17*a18 + a19*a20*a21$$

We now find that s1b can fit into any of the blocks together with x2, x3, ... x8.

We proceed to split up equations x2, x3, ... x8 into x2a, x2b, x3a, ... x8b.

We find that x1a, x2a, x3a ... x8a will fit into one functional block and x1b, x2b, ... x8b will fit into a second functional block.

By splitting the equations, we use only two functional blocks instead of eight.

Accordingly, the use interconnect for density procedure 14 begins by determining whether density is less than some threshold value (step 185). Density is the number of used outputs divided by the total number of outputs. In other words, if the number of unused outputs divided by the number of outputs is greater than a value N, where N is some constant, such as one, then the procedure will continue. A first output is selected (step 187), checked and subsequent outputs are selected and checked until all outputs have been checked (steps 195 and 189). Checking an output (step 191) consists of determining whether the cost of the output exceeds an output threshold. In particular, the ratio of the number of inputs to the number of available inputs is compared with a threshold constant, such as 0.9. Likewise the ratio of the number of product terms used by that output to the number of available product terms is compared with another threshold constant, such as 0.5. If either threshold is exceeded, the output is split (step 193) as in the split output step 11 shown in FIG. 11.

Referring again to FIGS. 1-4, once the functions and subfunctions or factors with their sets of product terms have been assigned to particular functional blocks, the device programmer 25, receiving instructions from computer 27 as to the established assignments, loads the subfunctions or factors into the functional blocks 51 of the programmable logic device 26. This is done by configuring the AND arrays 71 of each functional block 51 to carry out a first level of logic such that product terms corresponding to the subfunctions or factors are produced by the arrays 71 from the twenty-one available inputs. The OR array 75 of each functional block 51 is also configured to carry out a second level of logic such that the product terms produced by AND arrays 71 are combined to produce the subfunctions at the outputs 79. Product terms needed by more than one output may be combined in the shared terms portion of OR array 75, while product terms needed only once may be placed in the private terms portion in FIG. 4. Output macrocells 81 may also be configured at this time to latch or store signals on lines 77 and 78 or not and to configure the polarity of the signals on outputs 79.

The programmable interconnect matrix 53 is also configured to carry out a third level of logic, preferably logic AND, such that outputs from the functional blocks 51 representing the subfunctions or factors of a function are logically combined in the matrix 53 to produce the logic function on the output pins 57, 61 and 65. The matrix 53 is also configured to logically combine selected inputs from pins 55, these combined inputs then being connected to inputs of functional blocks 51.

The procedure just described assigns subfunctions, factors and product terms of a function to appropriate functional blocks and to the interconnect matrix or other third logic level means in an efficient manner. The procedure handles cases where a subfunction, factor or product term is too big for a functional block, by taking advantage of the recombining ability of the interconnect matrix to split up these large subfunctions, factors and product terms into smaller units. The result is a procedure that can program larger functions into a PLD than previously achievable.

We claim:

1. A process of programming a programmable logic device for carrying out a specified logic function, the programmable logic device to be programmed being of a type having multiple logic blocks, each logic block of said programmable logic device having input lines, output lines and successive configurable first and second arrays between said input lines and output lines for carrying out first and second levels of logic, said programmable logic device also having input pins, output pins and means, programmably combining selected output lines of said logic blocks, for carrying out a third level of logic, input lines to said logic blocks coupling to selected input pines of said programmable logic device and output lines from said means for carrying out the third level of logic coupling to selected output pins of said programmable logic device, the programming process comprising:

factoring a specified multiple output logic function into multiple factors using apparatus other than the programmable logic device that has been provided to be programmed, each factor being in sum-of-products form, wherein said factoring of said logic function includes replacing at least one pair of existing product terms of said logic function, with a corresponding "supercube" product term whose input terms consist only of those input terms which are present in both product terms of the replaced pair and whose output terms consist of those output terms which are present in either product term of the replaced pair and whose output terms consist of those output terms which are present in either product term of the replaced pair wherein plural sets of factors are determined for said logic function, each set of factors having a certain number of product terms, one particular set of factors that is found upon comparison with the other sets of factors that is found upon comparison with the other sets of factors to have a fewest number of product terms being a selected set for loading into said programmable logic device, loading each factor of the selected set of factors of said logic function into a logic block of said programmable logic device, the entire set of factors being loaded into a plurality of said logic blocks, wherein loading a factor includes configuring the first array for carrying out said first level of logic such that product terms corresponding to said factor are produced by said first array from signals on said input lines and configuring the second array for carrying out said second level of logic such that said product terms are combined to produce said factor at said output liens, and configuring said means for carrying out said third level of logic such that outputs from said logic blocks representing said factors are combined to produce said logic function at said output pins.

2. The process of claim 1 wherein said second level of logic provides programmable inversion and said third level of logic provides programmable inversion on its output lines.

3. The process of claim 1 wherein at least one of said factors has multiple outputs.

4. A process of programming a programmable logic device for carrying out a specified logic function, the programmable logic device to be programmed being of a type having multiple functional blocks, each functional block of said programmable logic device having a number of input lines, output lines and successive configurable first and second arrays between said input lines and output lines for carrying out first and second levels of logic, said programmable logic device also having input pins, output pins and a programmable interconnect matrix connected to said inputs and outputs of said functional blocks and to said input pins and output pins of said programmable logic device, said programmable interconnect matrix being configurable by means of programming so as to connect selected input pins of said programmable logic device to selected input lines of said functional blocks and to connect selected output lines of said functional blocks to selected output pins of said programmable logic device for carrying out a third level of logic, the programming process comprising:

assigning subfunctions of a specified logic function to be programmed into said programmable logic device to particular functional blocks using apparatus other than the programmable logic device that has been provided to be programmed, said logic function being representable as a plurality of subfunctions in sum-of-products form, each subfunction having a set of product terms with a certain number of input terms, selecting input terms to be logically combined in said programmable interconnect matrix whenever the number of input terms required by the subfunctions assigned to a particular functional block exceed the number of input lines to that functional block, the selected input terms being those input terms which are combined to form product terms of the assigned subfunctions, loading said assigned subfunctions into said particular functional blocks by configuring the first array of each functional block to carry out said first level of logic such that product terms corresponding to said subfunctions are produced by said first arrays from signals on said input lines and by configuring the second array of each functional block to carry out said second level of logic such that said product terms produced by said first arrays are combined in said second arrays to produce said subfunctions at said output lines, and configuring said programmable interconnect matrix for carrying out said third level of logic such that input terms received from said selected input pins are logically combined in said programmable interconnect matrix to produce combined input terms connected to said selected input liens of assigned functional blocks and such that outputs from said functional blocks representing said subfunctions are logically combined in said programmable interconnect matrix to produce said logic function on said output pins.

5. The process of claim 4 further defined by assigning each subfunction to an output cell in at least one functional block, such that each product term having more input terms than input lines available in an assigned functional block has selected input terms in that product term assigned to be logically combined in said programmable interconnect matrix prior to being loaded into said assigned functional block.

6. The process of claim 4 further defined by selecting input terms to reduce the number of product terms.

7. The process of claim 4 further defined by selecting the polarity of signals leading into and out of said programmable interconnect matrix.

8. The process of claim 4 wherein assigning subfunction to particular functional blocks includes splitting any large subfunction into a plurality of smaller subfunctions whenever a size of that large subfunction exceeds a predetermined size limit of a functional block, and then assigning each of said smaller subfunctions to a functional block.

9. The process of claim 8 wherein said large subfunction to be split exceeds the number of input terms available to a functional block.

10. The process of claim 8 wherein said large subfunction to be split exceeds the number of product terms available to a functional block.

11. The process of claim 8 wherein splitting a subfunction comprises an OR factorization in which product terms of said subfunction are grouped into at least two smaller subfunctions that are mapped onto output cells.

12. The process of claim 8 wherein splitting a subfunction comprises an AND factorization.

13. The process of claim 12 wherein said AND factorization is carried out by a Boolean factorization procedure.

14. The process of claim 4 wherein assigning each subfunction further comprises splitting at least one said subfunction assigned to a functional block into at least two subfunctions, whenever said functional block is assigned subfunctions such that a density measure is less than a predetermined threshold, and splitting subfunctions to use more output cells.

15. A process of programming a programmable logic device for carrying out a specified logic function, the programmable logic device to be programmed being of a type having multiple functional blocks, each functional block having input lines, output lines and successive configurable first and second arrays between said input lines and output lines for carrying out first and second levels of logic, said programmable logic device also having input pins, output pins and a programmable interconnect matrix connected to said inputs and outputs of said functional blocks and to said input pins and output pins of said programmable logic device, said programmable interconnect matrix being configurable by means of programming so as to connect selected input pins of said programmable logic device to selected input lines of said functional blocks and to connect selected output lines of said functional blocks to selected output pins of said programmable logic device for carrying out a third level of logic, the programming process comprising:

assigning subfunctions of a specified logic function to be programmed into said programmable logic device to particular functional blocks using apparatus other than the programmable logic device that has been provided to be programmed, said specified logic function being a multiple output function representable as a plurality of single output subfunctions in sum-of-products form, each subfunction having a set of product terms, the assigning of said subfunctions to particular functional blocks being carried out such that wherever a large subfunction exceeds a size limit of a functional block the assigning of said subfunctions splits said large subfunctional into a plurality of smaller subfunctions and assigns said smaller subfunctions to at least two separate functional blocks, loading said assigned subfunctions into said particular functional blocks by configuring the first array of each functional block to carry out said first level of logic such that product terms corresponding to said subfunctions are produced by said first arrays from signals on said input lines and by configuring the second array of each functional block to carry out said second level of logic such that said product terms produced by said first arrays are combined in said second arrays to produce said subfunctions at said output lines, and configuring said programmable interconnect matrix for carrying out said third level of logic such that said outputs from said functional blocks representing said subfunctions are logically combined in said programmable interconnect matrix to produce said logic function on said output pins.

16. The process of claim 15 wherein said provided programmable logic device includes means for selecting the polarity of signals leading into and out of said programmable interconnect matrix.

17. The process of claim 15 wherein said large subfunction to be split exceeds the number of input terms available to a functional block.

18. The process of claim 15 wherein said large subfunction to be split exceeds the number of product terms available to a functional block.

19. The process of claim 15 wherein splitting a subfunction comprises an OR factorization in which product terms of said subfunction are grouped into subfunctions that are mapped onto output cells.

20. The process of claim 15 wherein splitting a subfunction comprises an AND factorization.

21. The process of claim 20 wherein said AND factorization is carried out by a Boolean factorization procedure.

22. The process of claim 15 wherein assigning each subfunction further comprises splitting at least one of said subfunctions assigned to a functional block into at least two subfunctions, whenever said functional block is assigned subfunctions such that a density measure is less than a predetermined threshold, and splitting subfunctions to use more output cells.

23. A process of programming a programmable logic device for carrying out a specified logic function, the programmable logic device to be programmed being of a type having multiple functional blocks, each functional block having input lines, output lines and successive configurable first and second arrays between said input lines and output lines for carrying out first and second levels of logic, said programmable logic device also having input pins, output pins and a programmable interconnect matrix connected to said input lines and output lines of said functional blocks and to said input pins and output pins of said programmable logic device, said programmable interconnect matrix being configurable by means of programming so as to connect selected input pins of said programmable logic device to selected input lines of said functional blocks and to connect selected output lines of said functional blocks to selected output pins of said programmable logic device for carrying out a third level of logic, said programming process comprising:

assigning subfunctions of a specified logic function to be programmed into said programmable logic device to particular functional blocks using apparatus other than the programmable logic device that has been provided to be programmed, said specified logic function being a multiple output function representable as a plurality of single output subfunctions in sum-of-products form, each subfunction having a set of product terms, the assigning of said subfunctions to particular functional blocks being carried out such that wherever any functional block is initially assigned a set of one or more subfunctions such that a density measure of output lines used by the assigned subfunctions is less than a predetermined threshold, the assigning further includes splitting the subfunctions assigned to that functional block so as to use more output cells, loading said assigned subfunctions into said particular functional blocks by configuring the first array of each functional block to carry out said first level of logic such that product terms corresponding to said subfunctions are produced by said first arrays from signals on said input lines and by configuring the second array of each functional block to carry out said second level of logic such that product terms produced by said first arrays are combined in said second arrays to produce said subfunctions at said output lines, and configuring said programmable interconnect matrix for carrying out said third level of logic such that said outputs from said functional blocks representing said subfunctions are logically combined in said programmable interconnect matrix to produce said logic function on said output pins.

24. The process of claim 23 wherein said provided programmable logic device includes means for selecting the polarity of signals leading into and out of said programmable interconnect matrix.

* * * * *

UNITED STATES PATENT AND TRADEMARK OFFICE
CERTIFICATE OF CORRECTION

PATENT NO. : 5,349,691
DATED : September 20, 1994
INVENTOR(S) : David A. Harrison et al.

It is certified that error appears in the above-indentified patent and that said Letters Patent is hereby corrected as shown below:

On the title page, the title of the invention [54] "PROGRAMMING PROCESS FOR 3-LEVEL PROGRAMMING LOGIC DEVICES" should read - - PROGRAMMING PROCESS FOR 3-LEVEL PROGRAMMABLE LOGIC DEVICES - -.

Column 1, lines 3-4, the title "PROGRAMMING PROCESS FOR 3-LEVEL PROGRAMMING LOGIC DEVICES" should read - - PROGRAMMING PROCESS FOR 3-LEVEL PROGRAMMABLE LOGIC DEVICES - -.

Column 5, lines 31-32, "Shooter + TM" should read - - Shooter +$^{TM}$ - -.

Column 5, line 34, "Prolink TM" should read - - Prolink$^{TM}$ - -.

Column 6, line 56, "y = a*b*c̄*d +" should read - - y = a*b*c̄*d̄ + - -.

Column 9, line 7, " row —00—11 10" " should read - - row "00----11 10" - -.

Column 9, line 59, "cube "—11" " should read - - cube "-------- 11" - -.

Column 10, line 8, "p = 11—00—11" should read - - p = 11--00-- 11 - -.

UNITED STATES PATENT AND TRADEMARK OFFICE
CERTIFICATE OF CORRECTION

PATENT NO. : 5,349,691  
DATED : September 20, 1994  
INVENTOR(S) : David A. Harrison et al.

It is certified that error appears in the above-indentified patent and that said Letters Patent is hereby corrected as shown below:

Column 10, line 9, "q = —1100—11" should read -- q = --1100-- 11 --.

Column 10, lines 9-10, "q is "—00—11" " should read -- q is "----00-- 11" --.

Column 10, line 43, " "0—0—000—11" " should read -- "0-0-000- 11" --.

Column 10, line 44, " "—00—11" " should read -- "----00-- 11" --.

Column 10, lines 44-45, " "0—0—0—011" " should read -- "0-0-0-0-11" --.

Column 10, line 52, " "0—0—000—11" " should read -- "0-0-000- 11" --.

Column 10, line 52, " "—00—11" " should read -- "----00-- 11" --.

Column 10, line 53, " "0—0—00—11" " should read -- "0-0 --8- 11" --.

Column 12, line 36, "+ $d\bar{b}$" should read -- + $d*\bar{b}$ --.

UNITED STATES PATENT AND TRADEMARK OFFICE
CERTIFICATE OF CORRECTION

PATENT NO. : 5,349,691

DATED : September 20, 1994

INVENTOR(S) : David A. Harrison et al.

It is certified that error appears in the above-indentified patent and that said Letters Patent is hereby corrected as shown below:

Column 14, line 32, "$\overline{A} + \overline{B} = A.B$" should read -- $\overline{A} + \overline{B} = \overline{A.B}$ --.

Column 14, lines 62-64, on the line between the second and third equations, insert -- ... --.

Column 15, line 12, "s1b" should read -- x1b --.

Claim 1, column 16, lines 47-49, delete the repeated phrase: "and whose output terms consist of those output terms which are present in either product term of the replaced pair".

Claim 1, column 16, lines 55-56, delete the repeated phrase: "that is found upon comparison with the other sets of factors".

Claim 1, column 17, line 2, "output liens" should read -- output lines --.

Claim 4, column 17, line 67, "input liens" should read -- input lines --.

UNITED STATES PATENT AND TRADEMARK OFFICE
CERTIFICATE OF CORRECTION

PATENT NO. : 5,349,691
DATED : September 20, 1994
INVENTOR(S) : David A. Harrison et al.

It is certified that error appears in the above-indentified patent and that said Letters Patent is hereby corrected as shown below:

Claim 15, column 19, line 14, "subfunctional" should read - - subfunction - -.

Claim 23, column 20, line 51, "said outputs" should read - - outputs - -.

Signed and Sealed this

Fourteenth Day of March, 1995

Attest:

BRUCE LEHMAN

*Attesting Officer*       *Commissioner of Patents and Trademarks*